United States Patent
Momtaz et al.

(10) Patent No.: US 7,386,085 B2
(45) Date of Patent: Jun. 10, 2008

(54) METHOD AND APPARATUS FOR HIGH SPEED SIGNAL RECOVERY

(75) Inventors: Afshin Momtaz, Irvine, CA (US); Kambiz Vakilian, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1032 days.

(21) Appl. No.: 10/159,788

(22) Filed: May 30, 2002

(65) Prior Publication Data

US 2003/0223525 A1    Dec. 4, 2003

(51) Int. Cl.
*H04L 7/033*    (2006.01)

(52) U.S. Cl. .................. 375/376; 375/374; 327/157

(58) Field of Classification Search ............. 375/327, 375/374, 375, 376; 327/147, 148, 156, 157; 331/17
See application file for complete search history.

(56) References Cited

U.S. PATENT DOCUMENTS

| | | | |
|---|---|---|---|
| 5,384,502 A | 1/1995 | Volk | |
| 5,406,631 A | 4/1995 | Takeda et al. | |
| 5,479,126 A * | 12/1995 | Pan et al. | 331/17 |
| 5,495,512 A | 2/1996 | Kovacs et al. | |
| 5,564,089 A | 10/1996 | Barrett, Jr. | |
| 5,570,398 A | 10/1996 | Smith | |
| 5,572,163 A | 11/1996 | Kimura et al. | |
| 5,757,216 A | 5/1998 | Murata | |
| 5,864,249 A | 1/1999 | Shoji | |
| 5,867,333 A | 2/1999 | Saiki et al. | |
| 5,920,233 A | 7/1999 | Denny | |
| 6,011,822 A * | 1/2000 | Dreyer | 375/376 |
| 6,057,739 A | 5/2000 | Crowley et al. | |
| 6,255,873 B1 * | 7/2001 | Johnson et al. | 327/157 |
| 6,271,711 B1 | 8/2001 | Shenoy | |
| 6,292,061 B1 * | 9/2001 | Qu | 331/17 |
| 6,320,435 B1 * | 11/2001 | Tanimoto | 327/156 |
| 6,385,265 B1 * | 5/2002 | Duffy et al. | 375/374 |
| 6,775,344 B1 * | 8/2004 | Buhler et al. | 375/376 |
| 2002/0097825 A1 * | 7/2002 | Kawahara | 375/376 |
| 2003/0080818 A1 * | 5/2003 | McCarthy | 331/17 |
| 2003/0165208 A1 * | 9/2003 | Carter et al. | 375/373 |

* cited by examiner

*Primary Examiner*—Young T. Tse

(57) ABSTRACT

A closed-loop circuitry includes, in part, a loop filter and a current source/sink coupled to the loop filter to adjust the phase/frequency of the signal generated by the closed-loop circuitry. Because the voltage generated by the loop filter has a relatively low frequency, the current source/sink is operable at a relatively low frequency. Each current source and current sink may be a current digital-to-analog (DAC). The amount of current sourced into or sunk out of the loop filter by the current DAC is varied by setting the associated bits of a multi-bit signal. If the closed-loop circuitry is differential, a current source is coupled to the loop filter adapted to receive the differentially high signal, and a current source is coupled to the loop filter adapted to receive the differentially low signal.

26 Claims, 5 Drawing Sheets

METHOD AND APPARATUS FOR HIGH SPEED SIGNAL RECOVERY

CROSS-REFERENCES TO RELATED APPLICATIONS

The present application is related to and hereby incorporates by reference in its entirety application Ser. No. 09/540,243, entitled "GM CELL BASED CONTROL LOOPS", filed Mar. 31, 2000, now U.S. Pat. No. 6,526,113, issued on Feb. 25, 2003.

BACKGROUND OF THE INVENTION

The present invention relates to electronic circuits, and more particularly to adjustment of phase in high-speed clock and data recovery systems.

The increasing speed with which multiple types of data, such as text, audio and video, are transported over existing communication networks has brought to the fore the reliability with which such data transportation is carried out. In accordance with one conventional method, to ensure reliable data transfer, the data is first encoded with a reference clock signal at the transmitting end of the network to generate a composite signal. Thereafter, the composite signal is transmitted over the network to the receiving end. At the receiving end, the data and clock signals are recovered from the composite signal to ensure that the data and clock signals remain synchronous with respect to each other.

The clock and data recovery is typically carried out, for example, by a delay locked loop or a phase locked loop. In operation, a phase locked loop maintains a fixed relationship between the phase of the signal it receives and the phase of the signal it generates. FIG. 1 is a simplified block diagram of a conventional phase locked loop 10 adapted to extract the data and clock signals from composite signal Comp. Phase locked loop (PLL) 10 includes, among other components, phase detector 12, charge pump 14, loop filter 16, voltage controlled oscillator (VCO) 18 and flip-flop 20. The extracted clock signal Clk is supplied at the output terminal of VCO 18. Signals Clk and Comp are respectively applied to CK and D input terminal of flip-flop 20. Signal Data generated at the output terminal of flip-flop 20 is the data extracted form signal Comp. Once in a locked state, the phase of signal Clk generated by PLL 10 is locked to that of signal Comp received by PLL 10. The operation of PLL 10 is described further below.

Phase detector 12 receives signals Comp and Clk, and in response, generates signal A that corresponds to the difference between the phases of these two signals. Charge pump 14 receives signal A and in response generates current signal B whose magnitude varies depending on the magnitude of signal A. Loop filter 16 filters out the high frequency components of signal B and delivers the filtered-out signal to VCO 18.

If signal Comp leads signal Clk in phase—indicating that the VCO is running relatively slowly—signal A causes charge pump 14 to increase its output current I until VCO 18 achieves an oscillation frequency at which signal Clk is phase-locked with signal Comp. If, on the other hand, signal Comp lags signal Clk in phase—indicating that the VCO is running relatively fast—signal A causes charge pump 14 to reduce its output current B until VCO 18 achieves an oscillation frequency at which signal Clk is phase-locked with signal Comp.

FIG. 2 shows the current I generated by charge pump 14 versus the phase difference $\theta_e$ between signals Comp and Clk of FIG. 1. Ideally, when signal Clk is phase-locked with signal Comp, i.e., when $\theta_e$ is zero, current I generated by charge pump 14 is desired to be zero. Furthermore, ideally the magnitude of current I is desired to reach its highest value when $\theta_e$ is ±180°. The I-$\theta_e$ line for such an ideal PLL is designated with reference numeral 30. However, most PLLs exhibit non-ideal characteristics. Accordingly, for example, in PLL 10 current I is non-zero when $\theta_e$ is zero or vice versa, as shown by the I-$\theta_e$ line 35. This non-ideal shift in I-$\theta_e$ may reduce the noise immunity of PLL 10. Consequently, if PLL 10 is deployed in long-haul applications, in which case signal Comp delivered to PLL 10 is often noisy and distorted, the reduce noise immunity of PLL 10 may introduce instabilities in the phase relationship between signals Comp and Clk that, in turn, may violate the set-up time and hold time of flip-flop 20.

FIG. 3 is a simplified block diagram of a prior art PLL 40 that is adapted to partly overcome the above mentioned problems associated with PLL 10. PLL 40 includes, in part, an adjustable delay element 52 that receives the external signal Phase_adjust to adjust the phase of signal Clk before it is applied to flip-flop 50. The amount of delay of signal Clk through adjustable delay element 52 is varied by varying the value of signal Phase_adjust during a jitter tolerance test. During this test, a user deliberately introduces jitter and noise into signal Comp while at the same time continuously varying signal Phase_adjust until the tolerable limit of jitter is reached. In other words, signal Phase_adjust is varied until the maximum allowed error rate in the extracted data is reached. Signal Phase_adjust may be an analog signal or a digital signal, depending on the implementation of adjustable delay element 52.

Referring to FIG. 3, in some applications, the extracted clock signal Clk is required to operate at relatively very high frequencies, such as 10 GHz. Operating the clock signal Clk at such high frequencies causes a number of problems. First, adjusting the delay of a signal running at 10 GHz poses a challenging task. Second, the higher the operating frequency of a circuit, the greater is its power consumption. To accommodate the relatively higher power consumption, larger transistor sizes are required and thus greater semiconductor surface area is consumed which, in turn, increases the cost. Third, the higher the frequency, the greater is the current flow across parasitic capacitances. For example, the high frequency creates coupling between source/drain and the substrate regions of, e.g., MOS transistors used in adjustable delay circuit 52. This coupling may increase the noise coupling (i.e., cross-talk) between adjacent circuit blocks.

It is desired to have a Phase_adjustment technique which does not suffer from the high frequency related problems described above.

BRIEF SUMMARY OF THE INVENTION

In accordance with the present invention, a closed-loop circuitry, such as a PLL or DLL, includes a current source/sink coupled to the loop filter of the closed-loop circuitry to adjust the phase/frequency of the signal generated by the closed-loop circuitry. The loop filter receives a current signal from a charge pump or a transconductance (gm) cell and filters out the high frequency components of the current signal. Therefore, the output voltage signal generated by the loop filter has a low-frequency. Consequently, in accordance with the present invention, the current source/sink coupled to the loop filter is adapted to operate at a low frequency. The output voltage signal generated by the loop filter is applied to a voltage-controlled oscillator.

In some embodiments of the present invention, the current source and current sink each is a current digital-to-analog (DAC) each of which receives a multi-bit signal and in response sources or sinks a current. In a specific implementation, the current DAC sourcing current includes a number of p-channel MOS transistors each having an associated switch and each forming a different leg of a current mirror. Each leg supplies (i.e., sources) a current to the loop filter if a signal applied to the leg's associated switch is, e.g., at a logic high. The current DAC sinking current includes a number of n-channel MOS transistors each having an associated switch and each forming a different leg of a second current mirror. Each leg draws (i.e., sinks) a current from the loop filter if a signal applied to the leg's associated switch is, e.g., at a logic high.

In some embodiments of the present invention, the closed-loop circuitry operates differentially. Therefore, in these embodiments, the closed-loop circuitry includes a loop filter adapted to filter out the high frequency components of a differentially high signal, and a loop filter adapted to filter out the high frequency components of a differentially low signal. To adjust the phase/frequency of the signal generated by the voltage-controlled oscillator in such embodiments, a different current DAC supplies a current to each of the two loop filters. Each current DAC includes a number of p-channel MOS transistors each having an associated switch and each forming a different leg of a current mirror. Each leg supplies a current to the loop filter it is coupled to if a signal applied to the leg's associated switch is, e.g., at a logic high.

The following detailed descriptions and the accompanying drawings provide a better understanding of the nature and advantages of the of the present invention.

DETAILED DESCRIPTION OF THE INVENTION

In accordance with the present invention, the phase, frequency or both of a signal generated by a closed-loop circuitry, such as a phase locked loop (PLL), a delay locked loop (DLL), a frequency locked loop, or the like, is adjusted via one or more current sources and/or current sinks coupled to a loop filter disposed in the closed-loop circuitry. Because the loop filter is a low-pass filter, it filters out the high frequency components of the signals it receives and thus enables the current source/sink to operate at a low frequency. The phase-adjusting current source/sink is therefore not subject to high frequency problems. The following description is provided with reference to a PLL. However, it is to be understood that the PLL as described herein is for illustrative purposes only and that the present invention is similarly applicable to other types of closed-loop circuitry such as frequency locked loops, delay locked loops, and the like, that are adapted to lock the phase, frequency or both of a generated signal to that of a reference signal.

Figure 1:
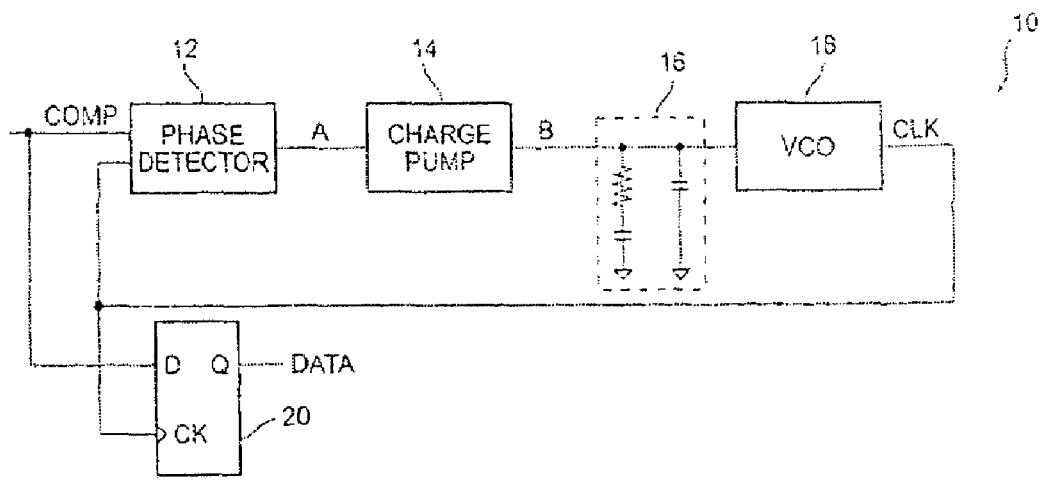
FIG. 1 is a simplified block diagram of a phase locked loop, as known in the prior art.
Figure 2:
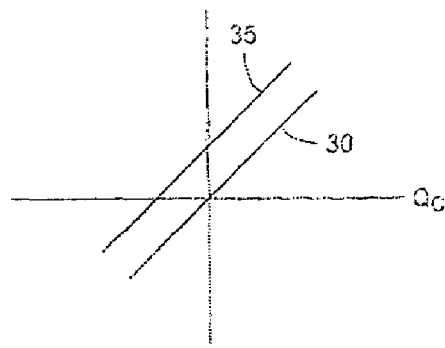
FIG. 2 shows the current vs. phase characteristics of an ideal and a non-ideal charge pump.
Figure 3:
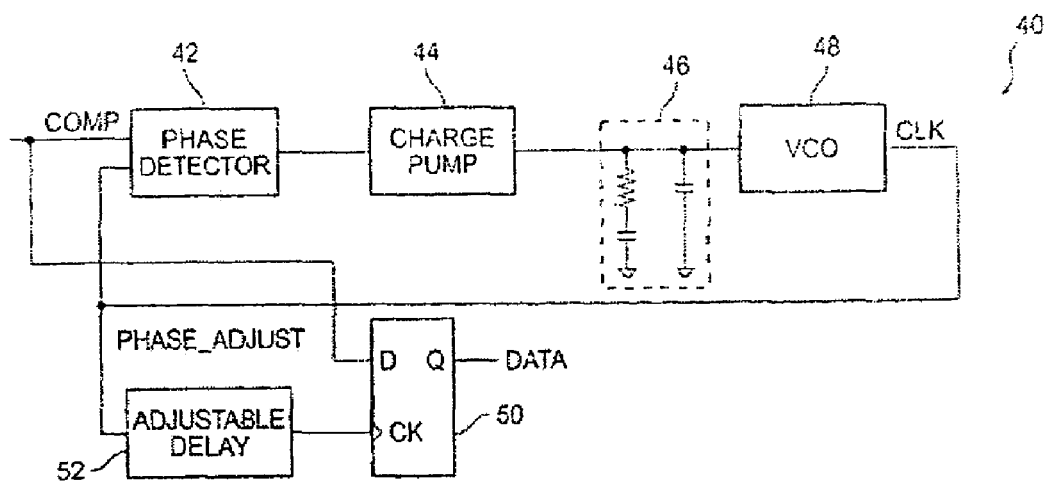
FIG. 3 is a simplified block diagram of a phase locked loop that includes a Phase_adjusting circuit, as known in the prior art.
Figure 4:
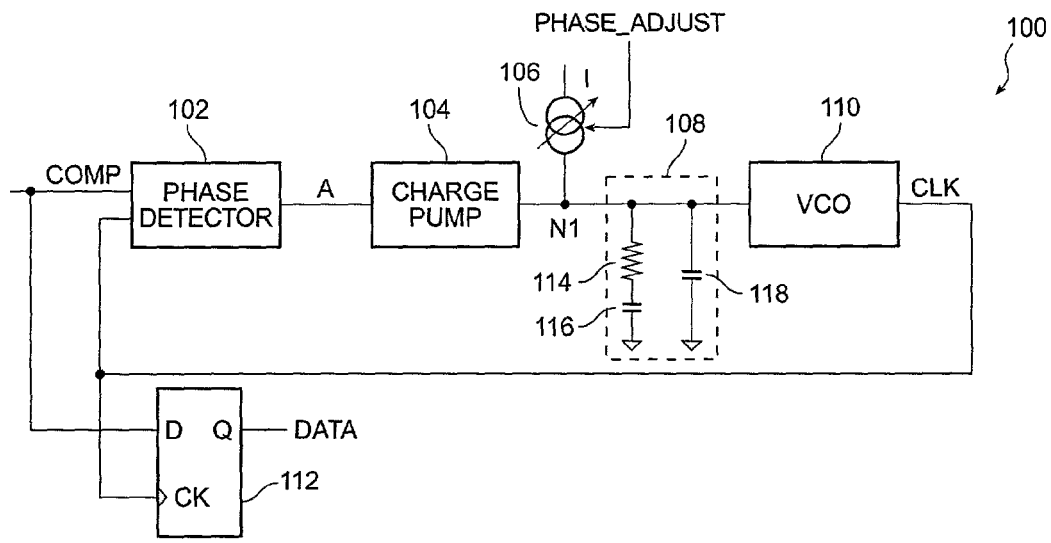
FIG. 4 is a simplified block diagram of a phase locked loop that includes a Phase_adjusting circuit, in accordance with one embodiment of the present invention.

FIG. 4 is a simplified block diagram of PLL 100 having a current source/sink 106 adapted to source current to or sink current from loop filter 108 in order to adjust the phase of signal Clk, in accordance with one embodiment of the present invention. Current source/sink 106 is coupled to loop filter 108, charge pump 104 and voltage-controlled oscillator (VCO) 110 via node N1. The operation of some of the blocks disposed in PLL 100 are described briefly below.

Phase detector 102 receives signals Comp and Clk, and in response, generates signal A that corresponds to the difference between the phases of signals Comp and Clk. Charge pump 104 receives signal A, and in response, supplies a current to node N1. The amount of current supplied by charge pump 104 to node N1 depends on the difference between the phases of signals Comp and Clk—as represented by signal A. Loop filter 108 filters out the high frequency components of the current supplied by charge pump 104 and delivers a filtered out voltage via node N1 to VCO 110. The frequency of signal Clk generated by VCO 110 depends primarily on the level of voltage supplied by loop filter 108. PLL 100 is in a locked state when the phase of signal Clk is locked to that of signal Comp.

By adjusting the amount of current delivered by current source/sink 106 to node N1, in accordance with the present invention, the voltage applied to VCO 110 and thus the frequency and phase of signal Clk is varied. Because loop filter 108 filters out the high frequency components of the current signal that it receives from charge pump 104, the output voltage generated by loop filter 108 at node N1 is a low-frequency signal.

Loop filter 108 includes resistors 114, 118 and capacitor 116. One of the terminals of resistor 114 is coupled to node N1. The other terminal of resistor 114 is coupled to one of the terminals of capacitor 116 whose other terminal is coupled to the ground. One of the terminals of capacitor 118 is coupled to node N1; the other terminal of capacitor 118 is coupled to the ground.

Loop filter 108 sets the closed-loop response of PLL 100. Charge pump 104 and VCO 110 both may have conventional implementations. The parameters defining the operational performance of VCO 110, such as the center frequency, the desired phase noise characteristic, the required frequency tuning range, the available operating voltages, etc., determine the value as well as the interconnection of the electrical components, such as transistors, resistors and capacitors, which collectively form the VCO. In some embodiments, VCO 110 is adapted to operate at approximately 10 GHz (the data rate for SONET OC-192). In other application, VCO 110 may operate at lower or higher frequencies than 10 GHz.

Figure 5:
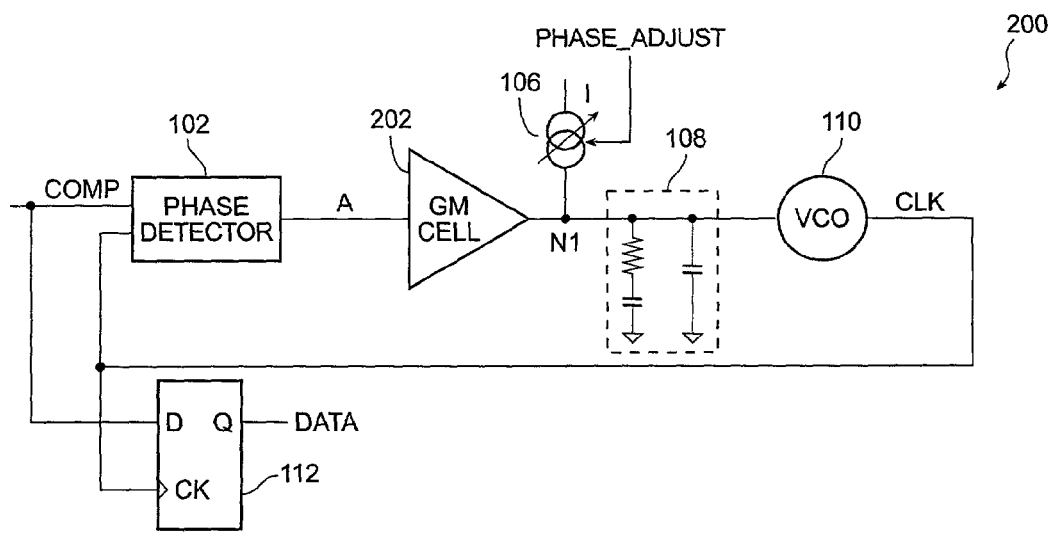
FIG. 5 is a simplified block diagram of a gm cell based phase locked loop that includes a Phase_adjusting circuit, in accordance with one embodiment of the present invention.

FIG. 5 is a simplified block diagram of a PLL 200, in accordance with another embodiment of the present invention. In PLL 200, a transconductance (gm) cell 202 supplies current to loop filter 108 and current source/sink 106 is used to adjust the phase of signal Clk relative to signal Comp. PLL 200 is different from PLL 100 in that PLL 200 deploys gm cell 202 in place of charge pump 104 (see FIG. 4). The gm cell (which is also referred to as a gm amplifier) is a transconductance amplifier converting the voltage signal that it receives from phase detector 102 to a current signal. The gm cell 202 reduces the switching noise generated by phase detector 102 when PLL 200 operates at high frequencies. One implementation for gm cell 202 is described in greater detail in application Ser. No. 09/540,243, filed Mar. 31, 2000, which is commonly owned and is incorporated herein by reference in its entirety. The following descriptions are provided with reference to a PLL employing a gm cell. However, it is to be understood that the same descriptions also applies to other types of PLLs and closed-loop circuits.

Figure 6:
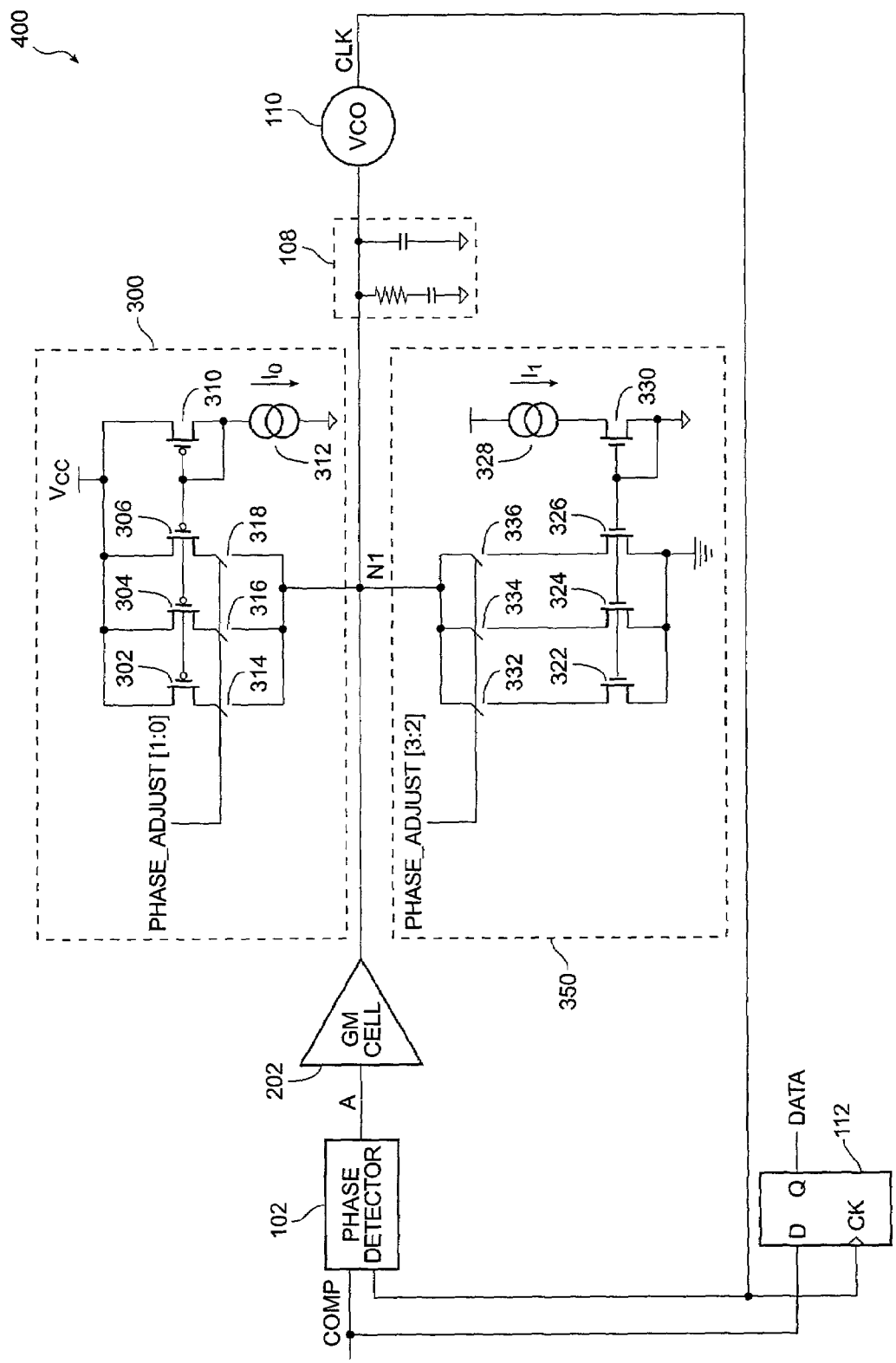
FIG. 6 is a schematic diagram of a phase locked loop that includes a phase adjusting current digital-to-analog converter, in accordance with one embodiment of the present invention.

FIG. 6 is a schematic diagram of a PLL 400, in accordance with one embodiment of the present invention. PLL 400 includes, a phase detector 102, a gm cell 202, a loop filter 108, a VCO 110, a flip-flop 112, a programmable current source 300, and a programmable current sink 350. In the following, each of programmable current source 300 and programmable current sink 350 is alternatively referred to as a current digital-to-analog converter (current DAC).

Current DAC 300 includes four p-channel MOS (hereinafter PMOS) transistors 302, 304, 306, 310, current source 312, and three switches 314, 316, 318. The source terminals of all four PMOS transistors 302, 304, 306, 310 are coupled to supply voltage Vcc. The gate terminals of all four PMOS transistors 302, 304, 306, 310 are coupled to one another and to the drain terminal of PMOS transistor 310. The drain terminal of PMOS transistor 302 is coupled to a first current carrying terminal of switch 314. Similarly, the drain terminal of PMOS transistor 304 is coupled to a first current carrying terminal of switch 316; and the drain terminal of PMOS transistor 306 is coupled to a first current carrying terminal of switch 318. A second current-carrying terminal of each of switches 314, 316, 318 is coupled to node N1. A control terminal of switch 314 receives bit 0 of signal Phase_adjust [1:0]. A control terminal of each of switches 316, 318 receives bit 1 of signal Phase_adjust[1:0].

Current DAC 300 is adapted to supply a current to node N1 in response to control signal Phase_adjust[1:0] to adjust the phase of signal Clk with respect to signal Comp, as described further below. If bits 0 and 1 of signal Phase_adjust are, e.g., set to 00, switches 314, 316 and 318 are all open. Accordingly, no current flows to node N1 via PMOS transistors 302, 304 and 306. If bits 0 and 1 of signal Phase_adjust are set to 01 respectively, switch 314 is closed and switches 316 and 318 are open. Accordingly, current $I_0$ flowing through PMOS transistor 310 is mirrored in PMOS transistor 302. Therefore, by setting bits 0 and 1 of signal Phase_adjust to 01, loop filter 108—in addition to receiving current from gm cell 202—also receives current 10. If bits 0 and 1 of signal Phase_adjust are set to 10 respectively, switch 314 is open and switches 316 and 318 are closed. Accordingly, current $I_0$ flowing through PMOS transistor 310 is mirrored in PMOS transistors 304 and 306. Therefore, by setting bits 0 and 1 of signal Phase_adjust to 10, loop filter 108 is supplied with additional current of $2*I_0$ (symbol * represents a multiplication operation). Similarly, If bits 0 and 1 of signal Phase_adjust are set to 11, switches 314, 316 and 318 are all closed. Accordingly, current $I_0$ flowing through PMOS transistor 310 is mirrored in PMOS transistors 302, 304 and 306. Therefore, by setting bits 0 and 1 of signal Phase_adjust to 11, loop filter 108 is supplied with additional current of $3*I_0$.

The current so supplied to node N1 by current DAC 300, increases the voltage of node N1, thereby increasing the frequency of VCO 110. The increase in the frequency of VCO 110, in turn, reduces the phase of signal Clk with respect to the phase of signal Comp. Since the voltage at node N1 is filtered (i.e., integrated) by loop filter 108, its rate of change with respect to time is relatively small. In other words, current DAC 300 is adapted to operate at a relatively low frequency to adjust the phase of signal Clk with respect to signal Comp. Those skilled in the art will appreciate that current DAC 300 may be modified (e.g., by adding more transistors and switches) to provide higher resolution or source more current to node N1.

Current DAC 350 includes four n-channel MOS (hereinafter NMOS) transistors 322, 324, 326, 330, a current source 328, and three switches 332, 334, 336. The source terminals of all four NMOS transistors 322, 324, 326, 330 are coupled to the ground terminal. The gate terminals of all four NMOS transistors 322, 324, 326, 330 are coupled to one another and to the source terminal of NMOS transistor 330. The drain terminal of NMOS transistors 322 is coupled to a first current carrying terminal of switch 332. Similarly, the drain terminal of NMOS transistors 324 is coupled to a first current carrying terminal of switch 334; the drain terminal of NMOS transistors 326 is coupled to a first current carrying terminal of switch 336. A second current-carrying terminal of each of switches 332, 334, 336 is coupled to node N1. A control terminal of switch 332 receives bit 2 of signal Phase_adjust[3:2]. A control terminal of each of switches 334, 336 receives bit 3 of signal Phase_adjust[3:2].

In operation, programmable current DAC 350 sinks (i.e., draws) a current from node N1 to adjust the phase of signal Clk with respect to signal Comp. If bits 2 and 3 of signal Phase_adjust are set to 00, switches 332, 334 and 336 are all open. Accordingly, no current flows from node N1 to the ground via any one of NMOS transistors 322, 324 and 326. If bits 2 and 3 of signal Phase_adjust are set to 01 respectively, switch 332 is closed and switches 334 and 336 are open. Accordingly, current $I_1$ flowing through NMOS transistor 330 is mirrored in NMOS transistor 322. The current mirrored in NMOS transistor 322 is drawn from node N1. Therefore, by setting bits 0 and 1 of signal Phase_adjust to 01, current $I_1$ is drawn from loop filter 108. If bits 0 and 1 of signal Phase_adjust are set to 10 respectively, switches 334 and 336 are closed and switch 332 is open. Accordingly, current $I_1$ flowing through NMOS transistor 330 is mirrored in NMOS transistors 324 and 326. Therefore, by setting bits 2 and 3 of signal Phase_adjust to 10, current of $2*I_1$ is drawn from loop filter 108. Similarly, If bits 2 and 3 of signal Phase_adjust are set to 11, switches 332, 334 and 336 are all closed. Accordingly, current $I_1$ flowing through NMOS transistor 330 is mirrored in all three NMOS transistors 322, 324 and 326. Therefore, by setting bits 2 and 3 of signal Phase_adjust to $I_1$, current of $3*I_0$ is drawn from loop filter 108. In some embodiments, current $I_1$ of DAC 350 is equal to current $I_0$ of DAC 300.

The current so drawn from node N1 by current DAC 350 decreases the voltage of node N1, thereby decreasing the frequency of VCO 110. The decrease in the frequency of VCO 110, in turn, increases the phase of signal Clk with respect to the phase of signal Comp. Since node N1 is a low frequency node, current DAC 350 is adapted to operate at a relatively low frequency to adjust the phase of signal Clk with respect to signal Comp. Those skilled in the art will appreciate that current DAC 350 may be modified (e.g., by adding more transistors and switches) to provide higher resolution or sink more current from node N1.

Figure 7:
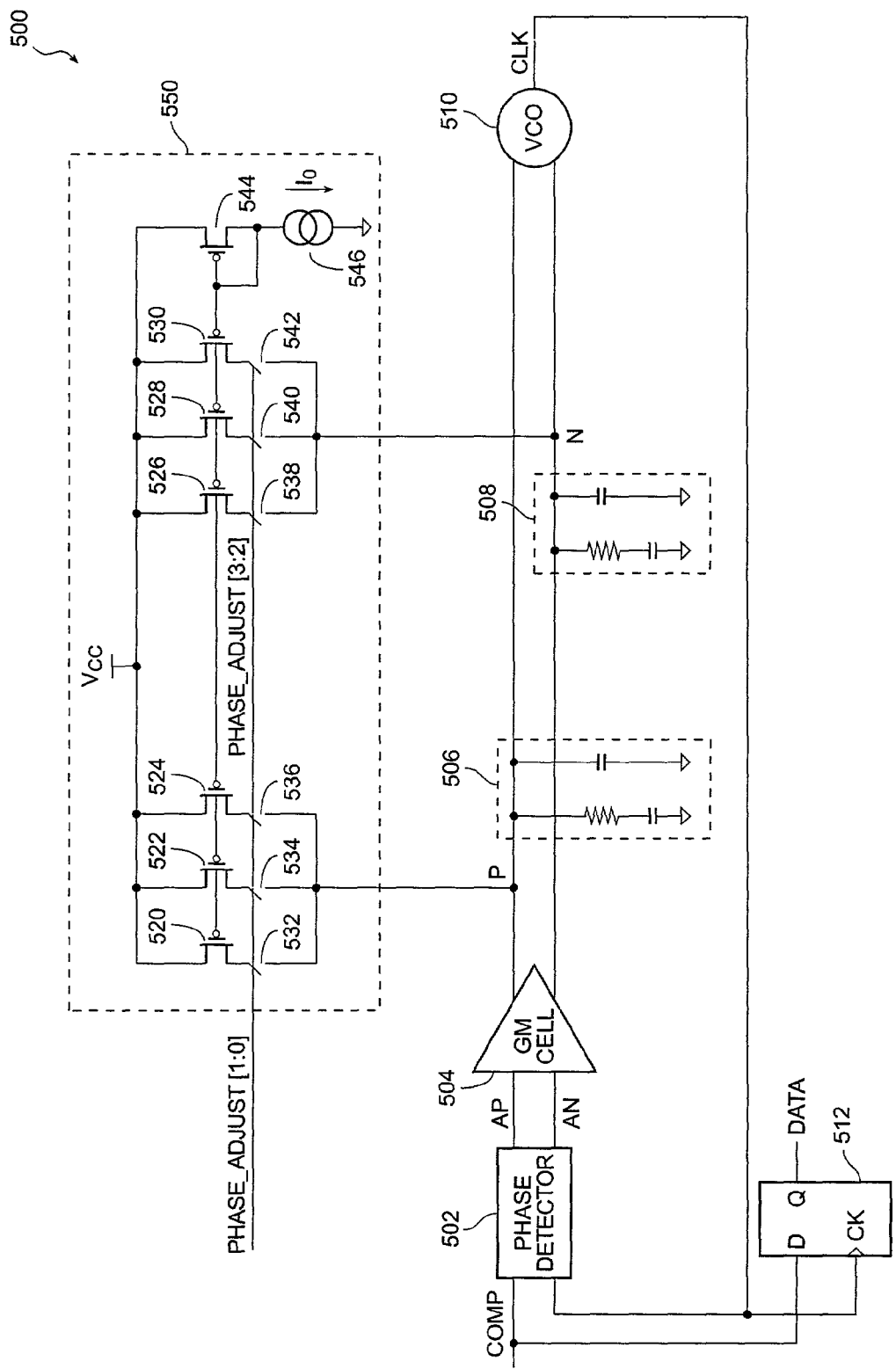
FIG. 7 is a schematic diagram of a differential phase locked loop that includes a Phase_adjusting current digital-to-analog converter, in accordance with another embodiment of the present invention.

FIG. 7 is a schematic diagram of a differential PLL 500, in accordance with another embodiment of the present invention. PLL 500 includes, a phase detector 502, a gm cell 504, loop filters 506, 508, a VCO 510, a flip-flop 512 and current DAC 550. PLL 500 operates differentially, in part, to have an improved noise immunity. Accordingly, in PLL 550, each of the signals generated by phase detector 502 and gm cell 504 includes a pair of signals, namely a differentially high and a differentially low signal. For example, the signal corresponding to the phase difference between signals Comp and Clk—generated by phase detector 502—includes a pair of differential signals AP and AN, as shown in FIG. 7. Similarly, gm cell 504 supplies a differential current pair, one of which is supplied to node P and the other one to node N. Node P has an associated loop filter 506; node N has an associated loop filter 508. Loop filters 506 and 508 form a differential loop filter which supplies a differential voltage to VCO 510.

In this exemplary embodiment, current DAC 550 includes six PMOS transistors 520, 522, 524, 526, 528, 530, six switches 532, 534, 536, 538, 540, 542, PMOS transistor 544 and current source 546. The source terminals of PMOS transistors 520, 522, 524, 526, 528, 530, 544 are coupled to supply voltage Vcc. The gate terminals of PMOS transistor 520, 522, 524, 526, 528, 530, 544 are coupled to the drain terminal of PMOS transistor 544 and to a first terminal of current source 546. The drain terminal of PMOS transistor 520 is coupled to a first current carrying terminal of switch 532. Similarly, the drain terminal of PMOS transistors 522 is coupled to a first current carrying terminal of switch 534; the drain terminal of PMOS transistors 524 is coupled to a first current carrying terminal of switch 536. A second current-carrying terminal of each of switches 532, 534, 536 is coupled to node P. Bit 0 of signal Phase_adjust[3:0] is applied to a control terminal of switches 532. Bit 1 of signal Phase_adjust[3:0] is applied to a control terminal of each of switches 534, 536. The drain terminal of PMOS transistor 526 is coupled to a first current carrying terminal of switch 538. Similarly, the drain terminal of PMOS transistors 528 is coupled to a first current carrying terminal of switch 540; the drain terminal of PMOS transistors 530 is coupled to a first current carrying terminal of switch 542. A second current-carrying terminal of each of switches 538, 540, 542 is coupled to node N. Bit 2 of signal Phase_adjust[3:0] is applied to a control terminal of switch 538. Bit 3 of signal Phase_adjust[3:0] is applied to a control terminal of each of switches 540, 542.

In operation, current DAC 550 supplies a current to nodes N and P of the differential loop filter to adjust the phase of signal Clk with respect to signal Comp, as described further below. If bits 0 and 1 of signal Phase_adjust are set to 00, switches 532, 534 and 536 are all open. Accordingly, no current flows to node P via PMOS transistors 520, 522 and 524. If bits 0 and 1 of signal Phase_adjust are set to 01 respectively, switch 532 is closed and switches 534 and 536 are open. Accordingly, current $I_0$ flowing through PMOS transistor 544 is mirrored in PMOS transistor 520. Therefore, by setting bits 0 and 1 of signal Phase_adjust to 01, current $I_0$ is supplied (i.e., sourced) to loop filter 506 via node P. If bits 0 and 1 of signal Phase_adjust are set to 10 respectively, switches 534 and 536 are closed and switch 532 is open. Accordingly, current $I_0$ flowing through PMOS transistor 544 is mirrored in PMOS transistors 522 and 524. Therefore, by setting bits 0 and 1 of signal Phase_adjust to 10, loop filter 506 is supplied with additional current of $2*I_0$. Similarly, If bits 0 and 1 of signal Phase_adjust are set to 11, switches 532, 534 and 536 are all closed. Accordingly, current $I_0$ flowing through PMOS transistor 544 is mirrored in PMOS transistors 520, 522 and 524. Therefore, by setting bits 0 and 1 of signal Phase_adjust to 11, loop filter 506 is supplied with additional current of $3* I_0$.

The current so supplied to loop filter 506 by current DAC 550, increases the voltage of node P, thereby increasing the frequency of VCO 510. The increase in the frequency of VCO 510, in turn, reduces the phase of signal Clk with respect to the phase of signal Comp. Since the voltage at node P is filtered by loop filter 506, its rate of change with respect to time is relatively small. Therefore, current DAC 550 is adapted to reduce the phase of signal Clk with respect to the phase of signal Comp at a relatively low frequency.

If bits 2 and 3 of signal Phase_adjust are set to 00, switches 538, 540 and 542 are all open. Accordingly, no current flows to node N via PMOS transistors 526, 528 and 530. If bits 2 and 3 of signal Phase_adjust are set to 01 respectively, switch 538 is closed and switches 540 and 542 are open. Accordingly, current $I_0$ flowing through PMOS transistor 544 is mirrored in PMOS transistor 526. Therefore, by setting bits 2 and 3 of signal Phase_adjust to 01, current 10 is sourced to loop filter 508 via node N. If bits 2 and 3 of signal Phase_adjust are set to 10 respectively, switches 540 and 542 are closed and switch 538 is open. Accordingly, current $I_0$ flowing through PMOS transistor 544 is mirrored in PMOS transistors 528 and 530. Therefore, by setting bits 2 and 3 of signal Phase_adjust to 10, loop filter 508 is supplied with additional current of $2*I_0$. Similarly, If bits 2 and 3 of signal Phase_adjust are set to 11, switches 538, 540 and 542 are all closed. Accordingly, current $I_0$ flowing through PMOS transistor 544 is mirrored in PMOS transistors 526, 528 and 530. Therefore, by setting bits 2 and 3 of signal Phase_adjust to 11, loop filter 508 is supplied with additional current of $3*I_0$.

The current so supplied to loop filter 508 by current DAC 550 increases the voltage of node N, thereby decreasing the frequency of VCO 510. The reduction in the frequency of VCO 510, in turn, increases the phase of signal Clk with respect to the phase of signal Comp. Since the voltage at node N is filtered by loop filter 508, its rate of change with respect to time is relatively small. Therefore, current DAC 550 is adapted to increase the phase of signal Clk with respect to that of signal Comp at a relatively low frequency.

It is to be understood that current DACs 300, 350 and 550 (see FIGS. 6 and 7) are merely exemplary embodiments of current sources/sinks that may be coupled, in accordance with the present invention, to a loop filter of a closed-loop circuitry adapted to adjust the phase, frequency or both of a signal generated by the closed-loop circuitry. It is also to be understood that in a delay-locked loop (not shown) the phase-adjusting current source/sink, in accordance with the present invention, is coupled to a loop filter supplying a signal to a variable delay circuit (not shown). The variable delay circuit varies the phase of the signal it receives until it is delay locked to a reference signal.

Figure 8:
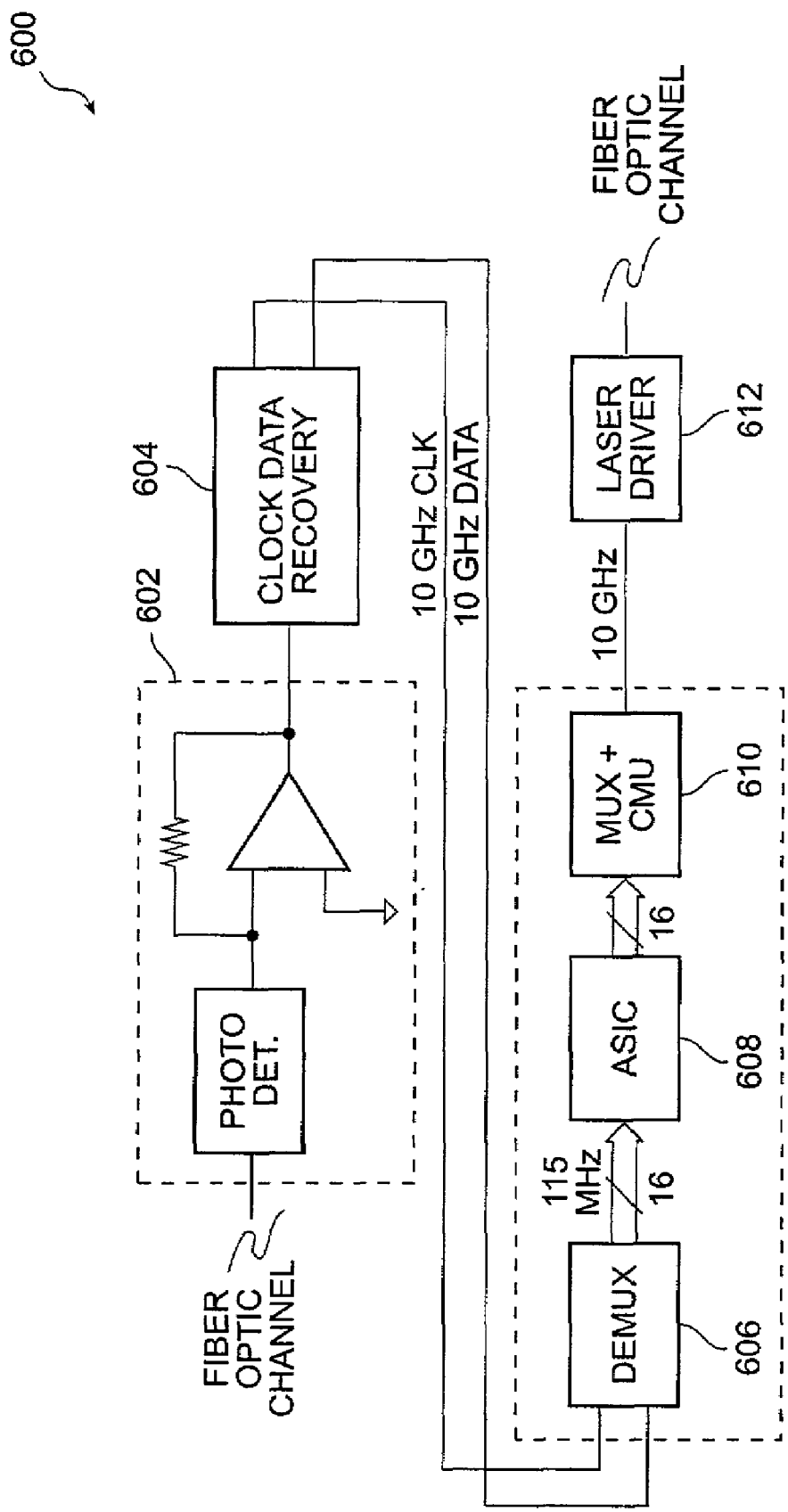
FIG. 8 is a simplified block diagram of a transceiver adapted to facilitate interconnecting high speed fiber optic communication channels and which includes a clock and data recover system, in accordance with one embodiment of the present invention.

FIG. 8 is a simplified schematic diagram of an exemplary transceiver 600 which includes a clock data recovery circuit 604. Clock data recovery circuit 604 may be any of the closed-loop circuitry, e.g., PLL 100, PLL 200, PLL 400, PLL 500, described above. Transceiver 600 is typically disposed along fiber optic channels in high speed telecommunication networks. Transceiver 600 includes at its input a photo detect and driver circuit 602 that receives the input signal from the fiber optic channel. Photo detect and driver circuit 602 converts optical signal to electrical signal and supplies it to clock data recovery circuit 604, which in turn, recovers the clock and data signals that may be in the frequency range of, for example, 10 GHz, or higher. Established telecommunication standards require the transceiver to perform various functions, including data monitoring and error correction. These functions are performed at a lower frequency. Thus, transceiver 600 uses a demultiplexer 606 which deserializes the 10 GHz data stream into, for example, 16 parallel signals having a frequency of approximately 625 MHz. An application specific integrated circuit (ASIC) 608 then performs the monitoring and error correction functions at the lower (625 MHz) frequency. A multiplexer and clock multiplication unit (CMU) 610 converts the parallel signals back into a single bit stream at 10 GHz. This signal is then retransmitted back onto the fiber optic channel by a laser drive 612.

The above embodiments of the present invention are illustrative and not limiting. Various alternatives and equivalents are possible. The invention is not limited by the type of current source or current sink that is coupled to the loop filter disposed in the closed-loop circuitry adapted to adjust the phase, frequency, or both of a signal generated by the closed-loop circuitry. The invention is not limited by the number of control signals used to source current in or sink current out of the loop filter. The invention is not limited by the type of phase detector, gm cell or charge pump, VCO disposed in the PLL, DLL, or the like. Nor is the invention limited to a specific type of control loop, such as PLL, DLL or the like adapted to generate a signal whose phase/frequency is adapted to be adjusted with a current source/sink in accordance with the present invention.

The invention is not limited by the type of integrated circuit in which the present invention may be disposed. Nor is the invention limited to any specific type of process technology, e.g., CMOS, Bipolar, or BICMOS that may be used to manufacture the present invention. Other additions, subtractions or modifications are obvious in view of the present invention and are intended to fall within the scope of the appended claims.

What is claimed is:

1. A closed-loop circuit comprising:
a loop filter;
a current source coupled to the loop filter and adapted to supply current to the loop filter, wherein said current source is adapted to receive a first control signal that is not generated by the closed-loop circuit; and
a current sink coupled to the loop filter and adapted to sink current from the loop filter, wherein said current sink is adapted to receive a second control signal that is not generated by the closed-loop circuit,
wherein the current source, the current sink, the first control signal and the second control signal are adapted to, collectively, adjust a phase relationship between a signal produced by the closed-loop circuit and a reference signal.

2. The closed-loop circuit of claim 1 further comprising:
p1 an oscillator coupled to the loop filter and adapted to generate a signal whose frequency is controlled by a signal generated by the loop filter.

3. The closed-loop circuit of claim 2 wherein the oscillator is a voltage-controlled oscillator.

4. The closed-loop circuit of claim 3 further comprising:
a gm cell adapted to supply current to the loop filter.

5. The closed-loop circuit of claim 4 further comprising:
a phase detector adapted to receive the signal generated by the voltage-controlled oscillator and to receive the reference signal, the phase detector further adapted to generate a signal that corresponds to a difference between phases of the signals it receives and to supply the generated signal to the gm cell.

6. The closed-loop circuit of claim 5 further comprising:
a flip-flop adapted to receive at its clock terminal the signal generated by the voltage-controlled oscillator and to receive at its data terminal the reference signal.

7. The closed-loop circuit of claim 3 further comprising:
a charge pump adapted to supply current to the loop filter.

8. The closed-loop circuit of claim 7 further comprising:
a phase detector adapted to receive a signal generated by a variable delay circuit and to receive a reference signal, the phase detector further adapted to generate a signal that corresponds to a difference between phases of the signals it receives and to supply the generated signal to the charge pump.

9. The closed-loop circuit of claim 1 further comprising:
a variable delay circuit coupled to the loop filter and adapted to generate a signal whose phase corresponds to a signal generated by the loop filter.

10. The closed-loop circuit of claim 1 wherein said loop filter comprises a resistor having a first terminal coupled to a first terminal of a first capacitor and a second terminal coupled to a first terminal of a second capacitor, wherein a second terminal of each of the first and second capacitors is coupled to an electrical ground.

11. The closed-loop circuit of claim 10 wherein each of said first and second control signals is a digital signal each having one or more bits.

12. The closed-loop circuit of claim 11 wherein each of said current source and current sink comprises a current digital-to-analog converter.

13. The closed-loop circuit of claim 12 wherein said current digital-to-analog converter comprises one or more PMOS transistors each having an associated switch and each adapted to mirror a current flowing through a reference current source, each associated switch adapted to receive a different one of the one or more bits of the first control signal.

14. The closed-loop circuit of claim 12 wherein said current digital-to-analog converter comprises one or more NMOS transistors each having an associated switch and each adapted to mirror a current flowing through a reference current source, each associated switch adapted to receive a different one of the one or more bits of the second control signal.

15. A differential closed-loop circuit comprising:
a first loop filter adapted to filter out high frequency components of a differentially high signal;
a second loop filter adapted to filter out high frequency components of a differentially low signal;
a first current source coupled to the first loop filter and adapted to supply current to the first loop filter, said first current source further adapted to receive a first control signal that is not generated by the differential closed-loop circuit; and
a second current source coupled to the second loop filter and adapted to supply current to the second loop filter, said second current source further adapted to receive a second control signal that is not generated by the differential closed-loop circuit.

16. The differential closed-loop circuit of claim 15 further comprising:
an oscillator coupled to the first and second loop filters and adapted to generate a signal whose frequency corresponds to a difference of signals generated by the first and second loop filters.

17. The differential closed-loop circuit of claim 16 wherein the oscillator is a voltage-controlled oscillator.

18. The differential closed-loop circuit of claim 17 further comprising:
a gm cell adapted to supply current to each of the first and second loop filters.

19. The differential closed-loop circuit of claim 18 further comprising:
a phase detector adapted to receive the signal generated by the voltage-controlled oscillator and to receive a reference signal, the phase detector further adapted to generate a differential signal that corresponds to a difference between phases of the signals it receives and supply the generated differential signal to the gm cell.

20. The differential closed-loop circuit of claim 17 further comprising:
a charge pump adapted to supply current to each of the first and second loop filters.

21. The differential closed-loop circuit of claim 15 further comprising:
a variable delay circuit coupled to the first and second loop filters and adapted to generate a signal whose delay corresponds to a difference of signals generated by the first and second loop filters.

22. The differential closed-loop circuit of claim 21 further comprising:
a phase detector adapted to receive the signal generated by the variable delay circuit and to receive a reference signal, the phase detector further adapted to generate a differential signal that corresponds to a difference between phases of the signals it receives.

23. The differential closed-loop circuit of claim 15 wherein each of said first and second loop filters comprises a resistor having a first terminal coupled to a first terminal of a first capacitor and a second terminal coupled to a first terminal of a second capacitor, wherein a second terminal of each of the first and second capacitors is coupled to an electrical ground.

24. The differential closed-loop circuit of claim 15 wherein each of said first and second control signals is a digital signal each having one or more bits.

25. The differential closed-loop circuit of claim 24 wherein said first current source is a current digital-to-analog converter comprising one or more PMOS transistors each having an associated switch and each adapted to mirror a current flowing through a reference current source, each associated switch adapted to receive a different one of the one or more bits of the first control signal.

26. The differential closed-loop circuit of claim 24 wherein said second current source is a current digital-to-analog converter comprising one or more PMOS transistors each having an associated switch and each adapted to mirror a current flowing through a reference current source, each associated switch adapted to receive a different one of the one or more bits of the second control signal.

* * * * *

UNITED STATES PATENT AND TRADEMARK OFFICE
CERTIFICATE OF CORRECTION

PATENT NO. : 7,386,085 B2 Page 1 of 1
APPLICATION NO. : 10/159788
DATED : June 10, 2008
INVENTOR(S) : Afshin Momtaz et al.

It is certified that error appears in the above-identified patent and that said Letters Patent is hereby corrected as shown below:

Column 9, Line 63, Claim 2 please delete "p1"

Signed and Sealed this

Tenth Day of March, 2009

JOHN DOLL
*Acting Director of the United States Patent and Trademark Office*